United States Patent
Sugaya

(10) Patent No.: US 6,258,686 B1
(45) Date of Patent: Jul. 10, 2001

(54) MANUFACTURING METHOD OF SEMICONDUCTOR DEVICE AND SEMICONDUCTOR DEVICE

(75) Inventor: Hiroyuki Sugaya, Tokyo (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/333,681

(22) Filed: Jun. 16, 1999

(30) Foreign Application Priority Data

Jun. 17, 1998 (JP) ................................................. 10-170162

(51) Int. Cl.[7] ................................................. H01L 22/331
(52) U.S. Cl. ........................... 438/341; 438/348; 438/360
(58) Field of Search ..................................... 438/309, 341, 438/357, 348, 360

(56) References Cited

U.S. PATENT DOCUMENTS

| | | | |
|---|---|---|---|
| 5,468,658 | * 11/1995 | Bayraktaroglu | 438/312 |
| 5,877,540 | * 3/1999 | Naruse et al. | 257/587 |
| 5,926,725 | * 7/1999 | Saihara et al. | 438/481 |

FOREIGN PATENT DOCUMENTS 5-291286   11/1993   (JP) .
11-54520   2/1999   (JP) .

* cited by examiner

Primary Examiner—John F. Niebling
Assistant Examiner—Christopher Lattin
(74) Attorney, Agent, or Firm—Finnegan, Henderson, Farabow, Garrett & Dunner, L.L.P.

(57) ABSTRACT

A manufacturing method of a bipolar transistor that can reduce, without increasing capacitance between base-collector, withstand voltage deterioration and leakage between emitter-base is provided. On an upper surface of an active area of a semiconductor substrate on which an isolation structure is formed by a first insulating film, a first epitaxial growth layer is formed. Then, on an upper surface of a first epitaxial growth layer a third insulating layer is formed in an area larger than that of the first epitaxial growth layer. Thereafter, from a side surface of a first epitaxial growth layer, a second epitaxial growth layer is formed in an area larger than that of a third insulating layer. Thereafter, all over the surface of the semiconductor substrate a first poly-silicon layer, a fourth and fifth insulating layers are formed, an opening is opened with an area approximately equal with that of an active area, and inside the opening a second poly-silicon layer and emitter layer are formed. Thereby, a semiconductor device is obtained.

6 Claims, 10 Drawing Sheets

MANUFACTURING METHOD OF SEMICONDUCTOR DEVICE AND SEMICONDUCTOR DEVICE

BACKGROUND OF THE INVENTION

1. Field of the Invention

The present invention relates to a manufacturing method of semiconductor devices and to a semiconductor device. In concrete, the present invention relates to a manufacturing method of bipolar transistor semiconductor devices that is formed on a semiconductor substrate on which an isolation structure is formed with insulating layer, and to a bipolar transistor semiconductor device.

2. Description of the Related Art

FIG. 2A, FIG. 2B, FIG. 2C, FIG. 2D, FIG. 2E, FIG. 2F, FIG. 2G, and FIG. 2H are diagrams showing one example of a manufacturing method of a existing bipolar transistor. The existing bipolar transistor B can be manufactured as shown in FIG. 2A with a semiconductor substrate 51 in which an isolation structure is formed by a first insulating layer 53 consisting of silicon oxide.

That is, all over a surface of the semiconductor substrate 51, for instance, a substrate of a single crystal of p-type silicon, an impurity such as Sb or the like is implanted to form a collector electrode layer 52. Above a surface of a central area thereof, an active area 54 of which upper surface is exposed is disposed and this active area is doped by an impurity of low concentration to form a collector layer. The surroundings of the collector layer is insulated and isolated from the surrounding elements or the like, for instance surrounding active areas, by a first insulating layer 53 that is formed by the use of, for instance, LOCOS method or the like.

Upon manufacturing a bipolar transistor B, first, a silicon layer 55 is formed all over the surface of the semiconductor substrate 51 by non-selective epitaxial growth method. Thereby, as shown in FIG. 2B, on the first insulating layer 53 a first poly-silicon layer 57 is formed to be a part of a base electrode. Simultaneously therewith, on an upper surface of the active area 54 a first epitaxial layer 56 is formed to be a base layer.

Further, all over the surface of the semiconductor substrate 51 a silicon oxide layer is formed to be an insulating layer. As shown in FIG. 2C, this insulating layer is patterned to form a second insulating layer 58 to be a buffer layer over from an upper surface of the first epitaxial layer 56 to an upper surface of the first poly-silicon layer 57.

Next, as shown in FIG. 2D, all over the surface of the semiconductor substrate 51, a second poly-silicon layer 59 that contains an impurity such as B or the like in high concentration is formed to be a base electrode. Further, on the second poly-silicon layer 59 a third insulating layer 60 consisting of silicon oxide and a fourth insulating layer 61 consisting of silicon nitride are stacked to be an interlayer film.

Thereafter, as shown in FIG. 2E, an opening for pulling out an emitter layer 66 is opened, while positioning it at an approximate center of the second insulating layer 58, in the second poly-silicon layer 59 and the third and fourth insulating layers 60 and 61 by the use of anisotropic etching method. At this time, the opening 62 is opened to stop on the second insulating layer 58.

Thereafter, as shown in FIG. 2F, on an inner surface of the opening 62 a fifth insulating layer 63 is formed with silicon nitride. Then, another opening 64 is opened in the second insulating layer 58 by the use of anisotropic etching method to expose a first epitaxial layer 56.

Then, as shown in FIG. 2G, a third poly-silicon layer 65 that becomes an emitter electrode layer and contains an impurity such as Sb or the like in high concentration is formed inside the openings 62 and 64 so that a part thereof is positioned on an upper surface of the fourth insulating layer 61. Thereafter, thermal treatment is applied to form an emitter layer 66 inside the first epitaxial layer 56.

Finally, after a sixth insulating layer 67 consisting of silicon oxide is patterned all over the surface of the semiconductor substrate 51, a wiring 68 for pulling out an emitter electrode (the third poly-silicon layer 65) is formed. Thereby, a bipolar transistor B such as shown in FIG. 2H can be manufactured.

However, in a bipolar transistor B manufactured as described above, a base electrode layer is constituted of a first poly-silicon layer 57 that contains impurity of low concentration and a second poly-silicon layer 59 that contains impurity of high concentration. A base layer (the first epitaxial layer 56) has a structure to pull out through connection with the first poly-silicon layer 57 formed in the surroundings thereof.

The first poly-silicon layer 57 is, being formed on the first insulating film 53 by the use of non-selective epitaxial growth method, a polycrystalline layer. Moreover, since impurity concentration thereof can not be made high, a base resistance becomes substantially high. As a result of this, the transistor is retarded in operation of high speed and power consumption thereof increases.

Further, when an opening 62 is formed to pull out an emitter layer 66, if there occurs a discrepancy in alignment of a mask during photolithography, the opening 62 is formed at a position deviated from the center of the area of the second insulating layer 58. As a result of this, there is a concern that an emitter layer 66 that is formed later is liable to approach or connect electrically to the first poly-silicon layer 57 that is a base electrode layer. Accordingly, there is a problem that an withstand voltage deteriorates and leakage occurs between base-emitter.

In particular, since the opening 62 is preferable to be formed at an approximately identical area with an active area 54 and a base layer is formed only on an upper surface of the active area 54, a precise alignment of a mask is required. In addition, when a semiconductor device is made small, the active area is required to be small, and this is an increasingly important problem.

Further, FIG. 3A, FIG. 3B, FIG. 3C, FIG. 3D, FIG. 3E, FIG. 3F, and FIG. 3G are diagrams showing another existing manufacturing method of a bipolar transistor.

A base electrode layer of a bipolar transistor C manufactured according to the manufacturing method is, as shown in FIG. 3G, constituted so that it is pulled out from an upper surface of the base layer. The bipolar transistor C can be, as shown in FIG. 3A as identical as the aforementioned bipolar transistor B, manufactured with a semiconductor substrate 71 on which an isolation structure is formed with a first insulating layer 73 consisting of silicon oxide.

First, as shown in FIG. 3B, all over the semiconductor substrate 71 a second insulating layer 75 is formed to form a buffer layer. Then, on an upper surface of the second insulating layer 75 a first poly-silicon layer 76 that is a base electrode layer containing impurity in high concentration, a third insulating layer 77 that consists of silicon oxide and is an interlayer film, and a fourth insulating layer 78 consisting of silicon nitride are stacked.

Thereafter, as shown in FIG. 3C, an opening 79 for pulling out an emitter layer 83 is opened, while positioning on an approximate center of the active area 74, in the first poly-silicon layer 76, a third insulating layer 77, and a fourth insulating layer 78 by the use of anisotropic etching method. At this time, the opening 79 is stopped on the second insulating layer 75.

Then, as shown in FIG. 3D, on an inner surface of the opening 79 a fifth insulating layer 80 consisting of silicon nitride is formed. Thereafter, the second insulating layer 75 is etched to form a cavity 81 inside the second insulating layer 75 and expose the active area 74.

Thereafter, as shown in FIG. 3E, inside the cavity 81 an epitaxial growth layer 82 is formed by the use of epitaxial growth method to form a base layer.

Then, as shown in FIG. 3F, a second poly-silicon layer 84 containing impurity such as Sb or the like in high concentration is formed inside the opening 79 so that part thereof is located on an upper surface of the fourth insulating layer 78 to form an emitter layer. Thereafter, heat treatment is implemented to form an emitter layer 83 inside the epitaxial growth layer 82.

Finally, all over the surface of the semiconductor substrate 71 a fifth insulating layer 85 consisting of silicon oxide is patterned. After that, a wiring 86 for pulling out an emitter electrode layer outside is formed. Thereby, a bipolar transistor C such as shown in FIG. 3G can be manufactured.

According to this method, a base layer (epitaxial growth layer 82) is formed inside a cavity 81 opened in a second silicon oxide film. Accordingly, the base layer can be constituted of an epitaxial growth layer 82 containing impurity in high concentration. At this time, since the base electrode layer (the first poly-silicon layer 76) contains impurity of high concentration, resistance of the base layer can be substantially decreased.

In addition, a base layer, after the opening 79 is formed for the emitter electrode layer, is formed a cavity 81 in an area larger than the opening 79. Accordingly, even if there is a discrepancy in alignment of a mask during photolithography when the opening 79 is formed, between the side edge of the base layer and the emitter layer 83 a sufficient distance can be secured. Accordingly, sufficient withstand voltage can be secured between base-emitter.

However, according to this method, a cavity 81 that is used to form a base layer becomes, being formed by etching, an area larger than the opening 79 that pulls out the emitter layer 83. Accordingly, when the opening 79 is formed on the approximately same area as the active area 74, even the first insulating layer 73 is etched and removed. As a result of this, the junction area of base-collector becomes wide to increase a capacitance of base-collector. Therefore, there are problems that the fast response property of the transistor is deteriorated and power consumption is increased.

The present invention is carried out to solve such problems. An object of the present invention is to provide a manufacturing method of a bipolar transistor that can reduce deterioration of withstand voltage or leakage between base-emitter without increasing capacitance between the base-collector.

SUMMARY OF THE INVENTION

The present invention relates to a manufacturing method of a semiconductor device in which, in an active area of a semiconductor substrate in which an isolation structure is formed by an insulating layer consisting of silicon oxide, a collector layer is disposed. Here, the manufacturing method comprises a step of forming a first epitaxial growth layer that constitutes a part of a base layer on an upper surface of the active area by the use of selective epitaxial growth method, and a step of forming a second epitaxial growth layer that constitutes the other part of the base layer in the surroundings of the first epitaxial growth layer in an area larger than the active area.

Further, the present invention relates to a semiconductor device in which, on an active area of a semiconductor substrate in which an isolation structure is formed by an insulating layer, a collector layer is disposed. Here, on an upper surface of the semiconductor substrate a first epitaxial growth layer formed on the upper surface of the active area and a second epitaxial growth layer formed in the surroundings of the first epitaxial growth layer are disposed to constitute a base layer.

A semiconductor device of the present invention is a semiconductor device in which a collector layer is disposed on an active area of a semiconductor substrate on which an isolation structure is formed by an insulating layer, on an upper surface of the active area of the semiconductor substrate a base layer is disposed, and on an upper surface of the base layer a second insulating layer that is larger than at least the active area is disposed. Here, the base layer comprises a first epitaxial growth layer formed on the upper surface of the active layer by the use of epitaxial growth method, and a second epitaxial growth layer formed in the surroundings of the first epitaxial growth layer. Here, the second epitaxial growth layer, after forming an insulating layer capable of removing in the surroundings of the first epitaxial growth layer, is formed by forming a second insulating layer on the upper surface of the removable insulating layer, and thereafter by removing the removable insulating layer.

DESCRIPTION OF PREFERRED EMBODIMENT

FIG. 1A, FIG. 1B, FIG. 1C, FIG. 1D, FIG. 1E, FIG. 1F, FIG. 1G, FIG. 1H and FIG. 1I show a manufacturing method of a bipolar transistor A involving the present invention.

Figure 1A:
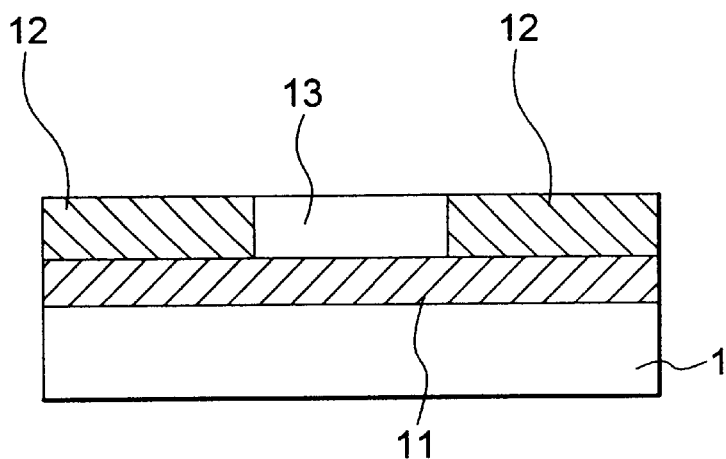
FIG. 1A, FIG. 1B, FIG. 1C, FIG. 1D, FIG. 1E, FIG. 1F, FIG. 1G and FIG. 1H are diagrams showing parts of a manufacturing method of a semiconductor device involving the present invention.
Figure 1B:
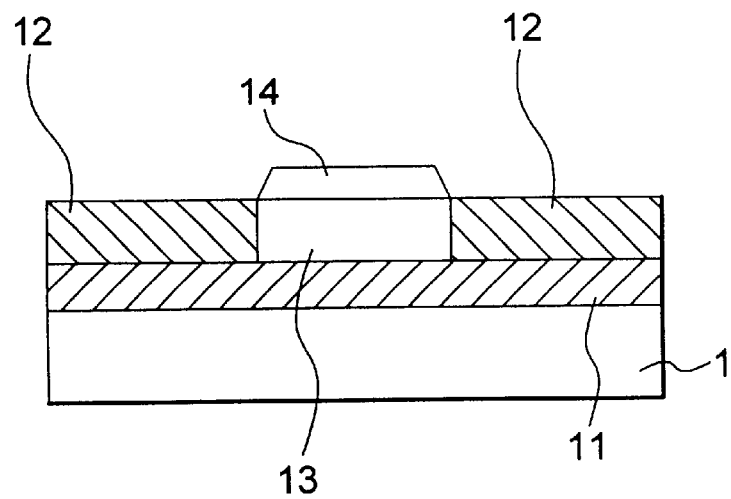
Figure 1C:
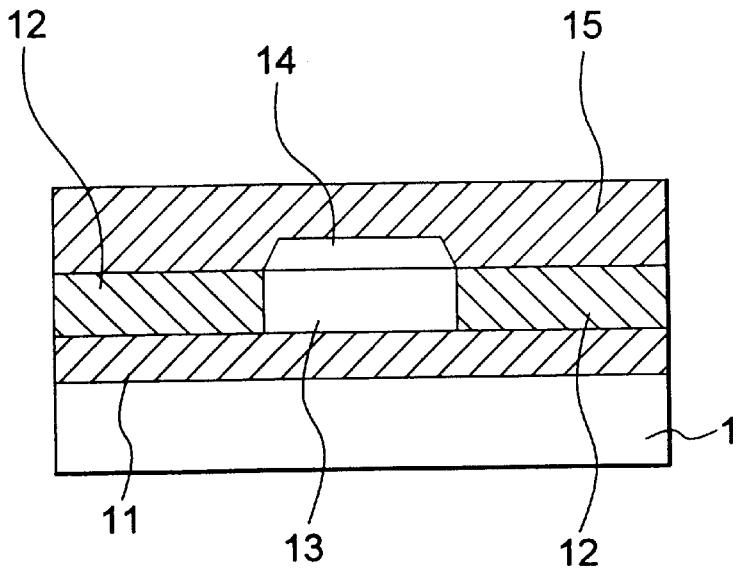
Figure 1D:
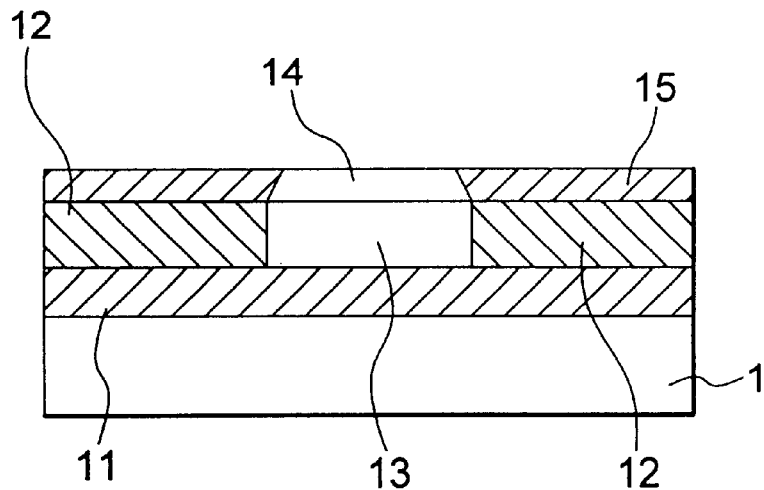
Figure 1E:
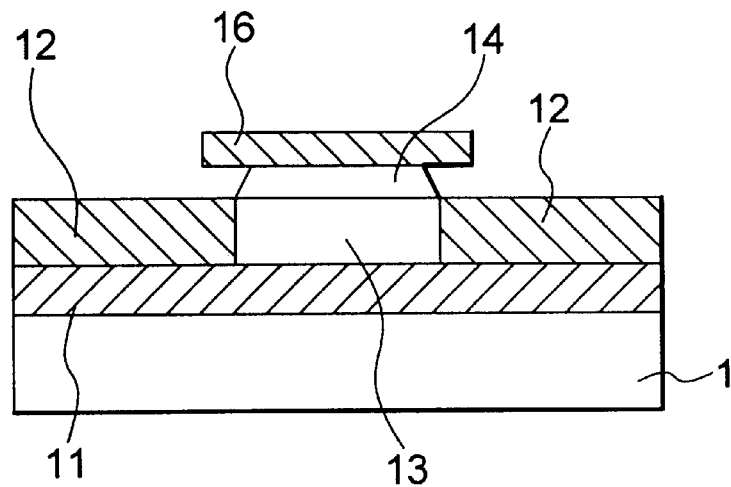
Figure 1F:
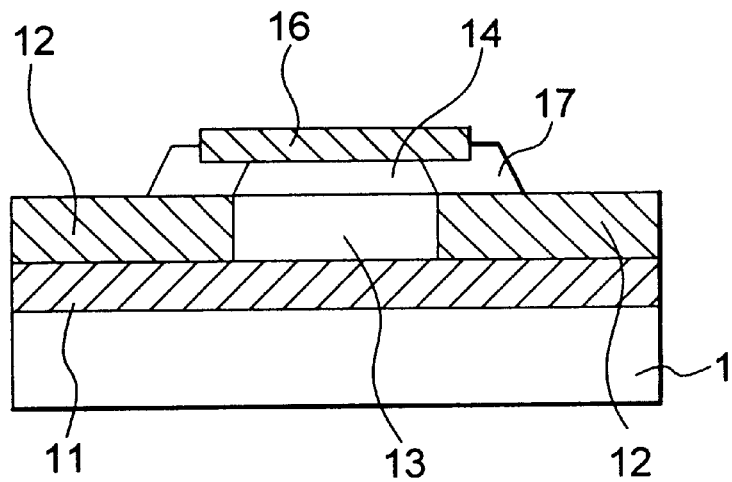
Figure 1G:
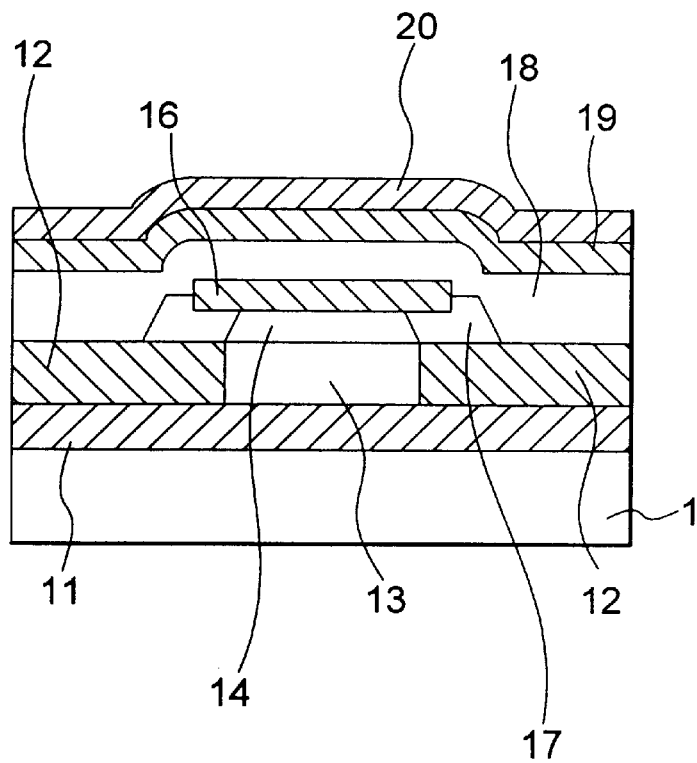
Figure 1H:
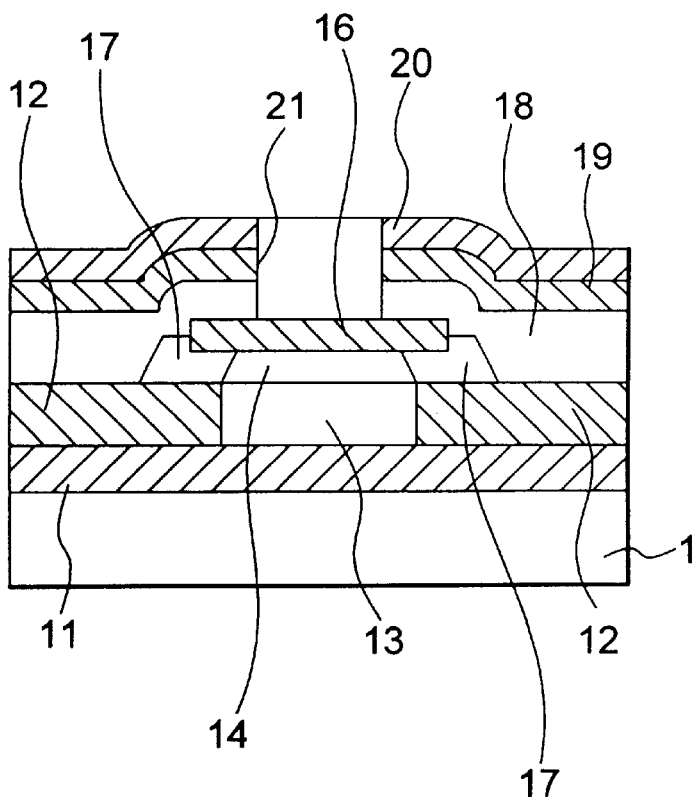
Figure 1I:
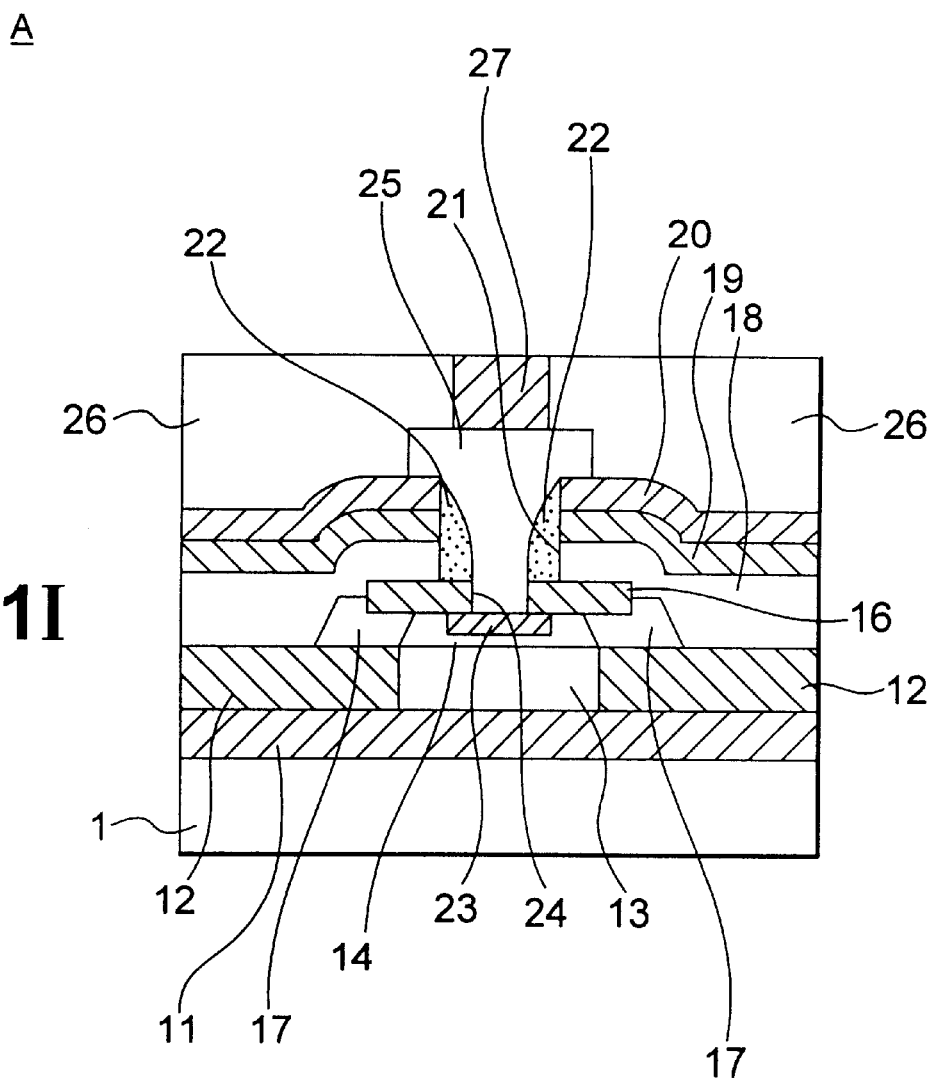
FIG. 1I is a continuation of FIG. 1H and is a schematic constitution of a semiconductor device of one embodiment of the present invention.
Figure 2A:
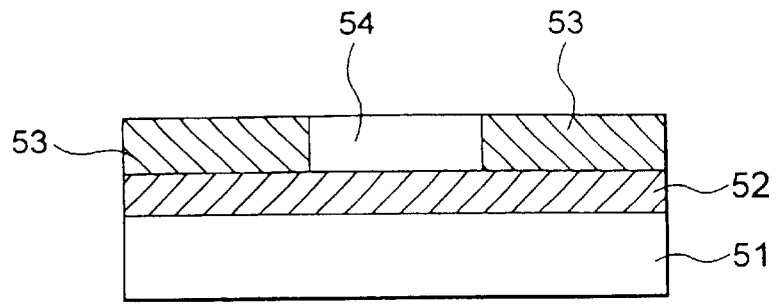
FIG. 2A, FIG. 2B, FIG. 2C, FIG. 2D, FIG. 2E, FIG. 2F, FIG. 2G and FIG. 2H are diagrams showing a manufacturing method of a semiconductor device involving a existing example.
Figure 2B:
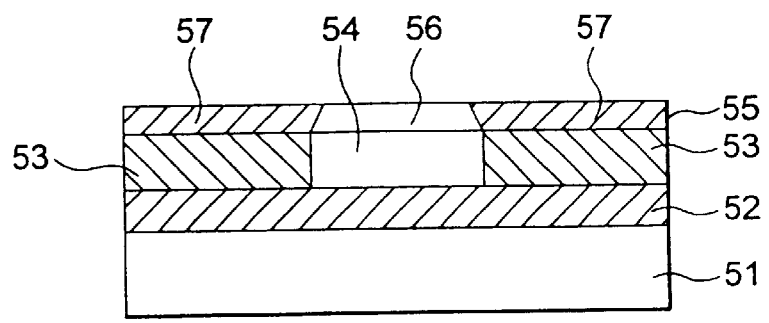
Figure 2C:
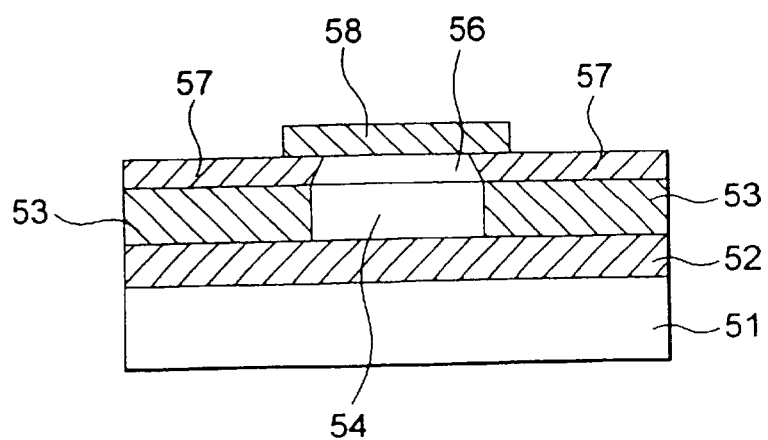
Figure 2D:
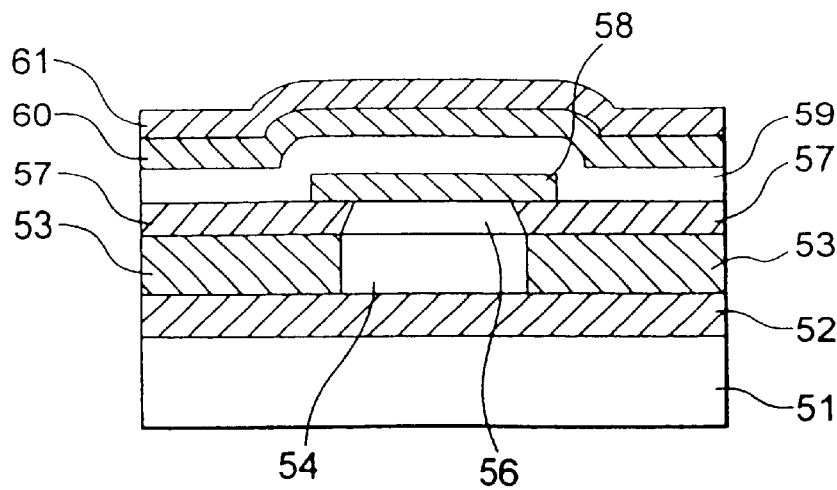
Figure 2E:
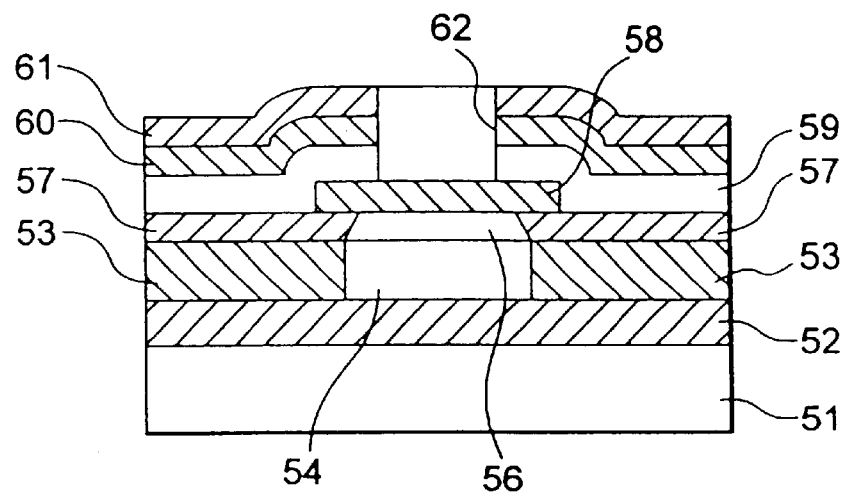
Figure 2F:
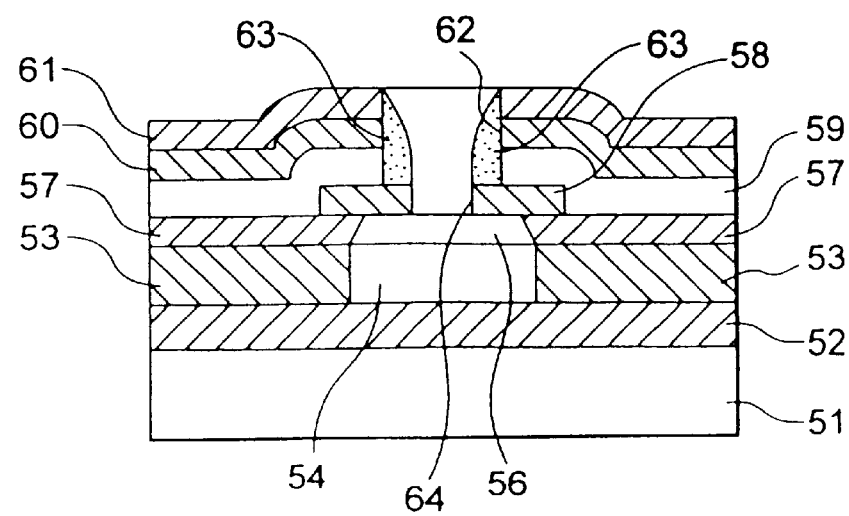
Figure 2G:
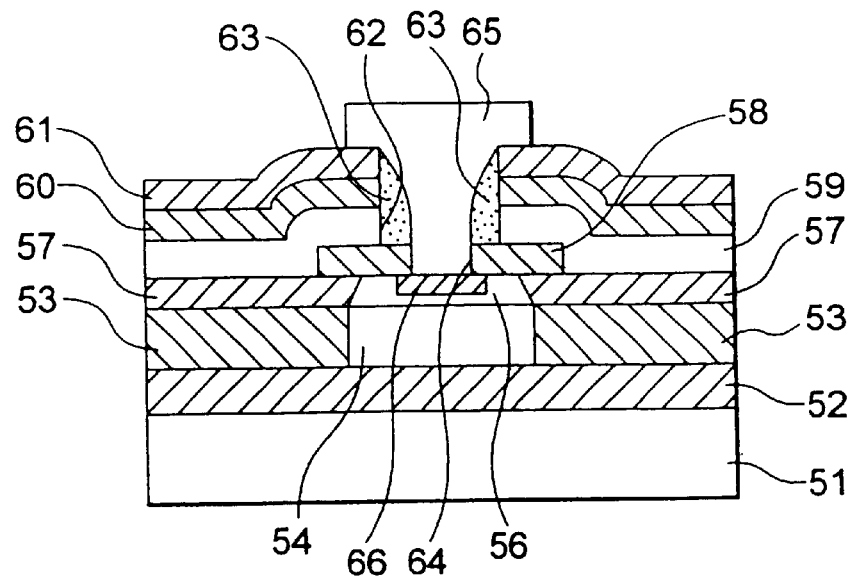
Figure 2H:
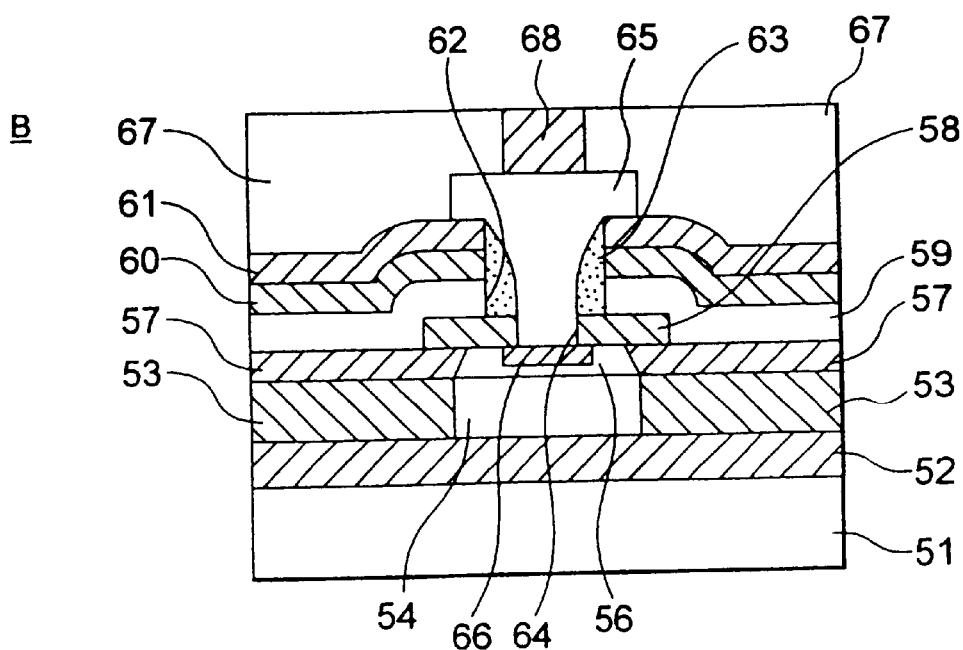
Figure 3A:
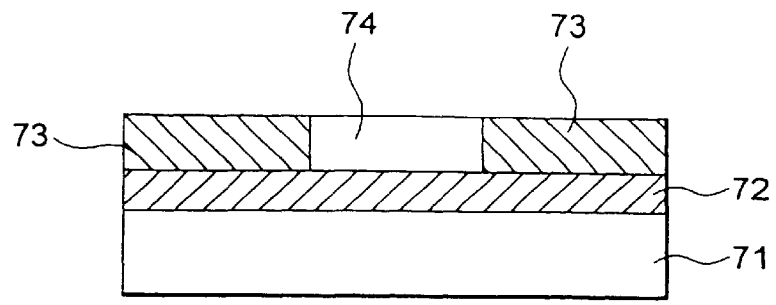
FIG. 3A, FIG. 3B, FIG. 3C, FIG. 3D, FIG. 3E, FIG. 3F, and FIG. 3G are diagrams showing another manufacturing method of a semiconductor device involving a existing example.
Figure 3B:
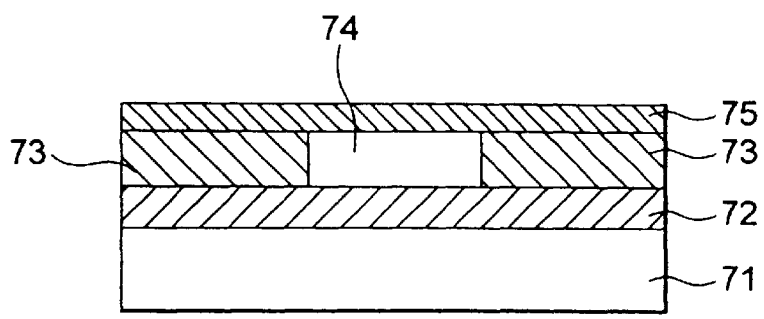
Figure 3C:
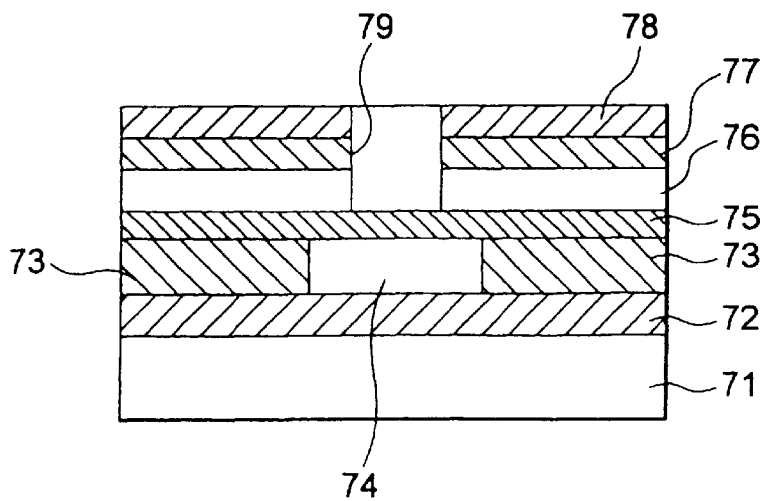
Figure 3D:
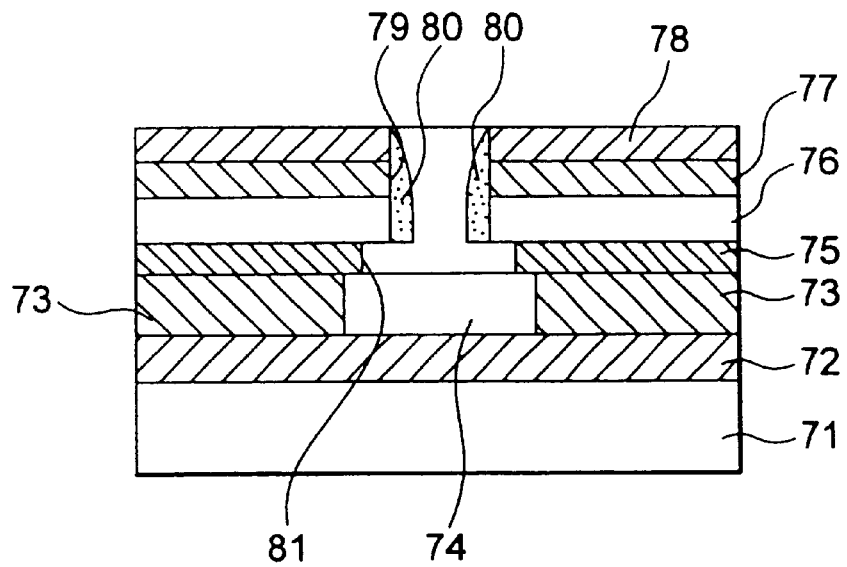
Figure 3E:
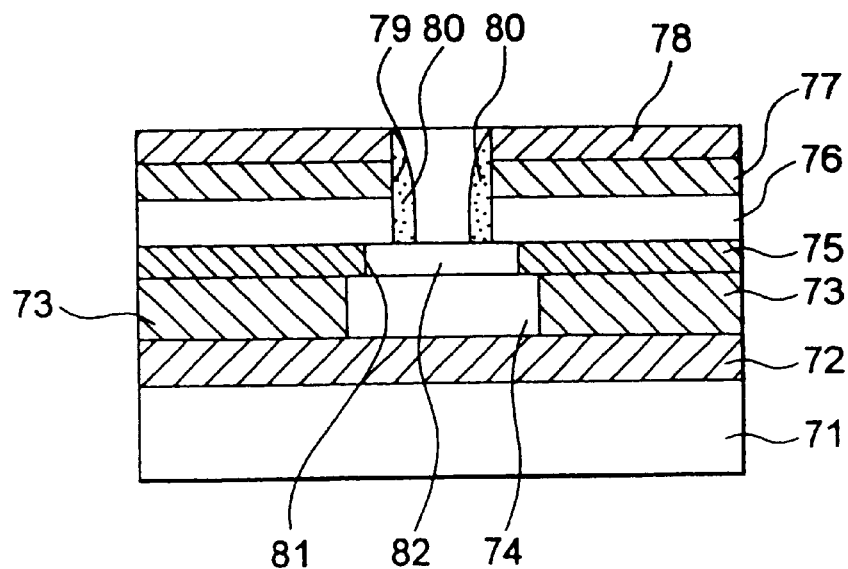
Figure 3F:
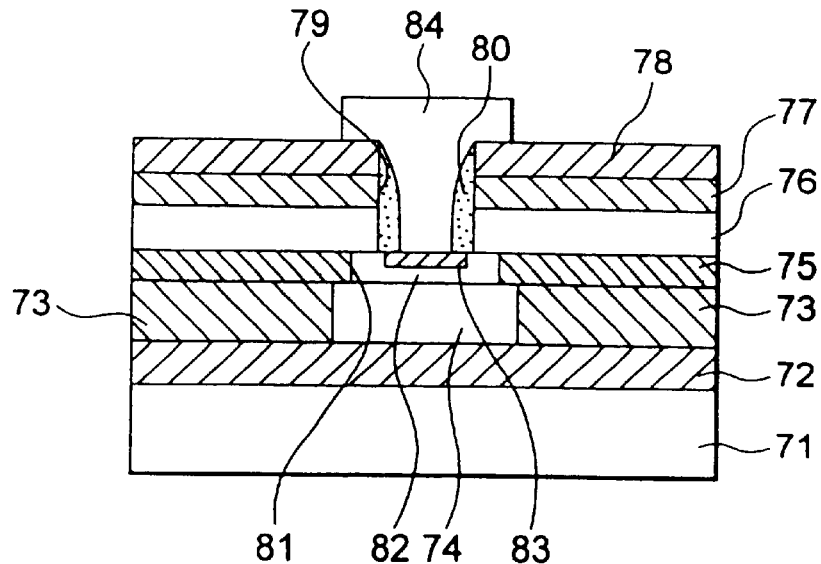
Figure 3G:
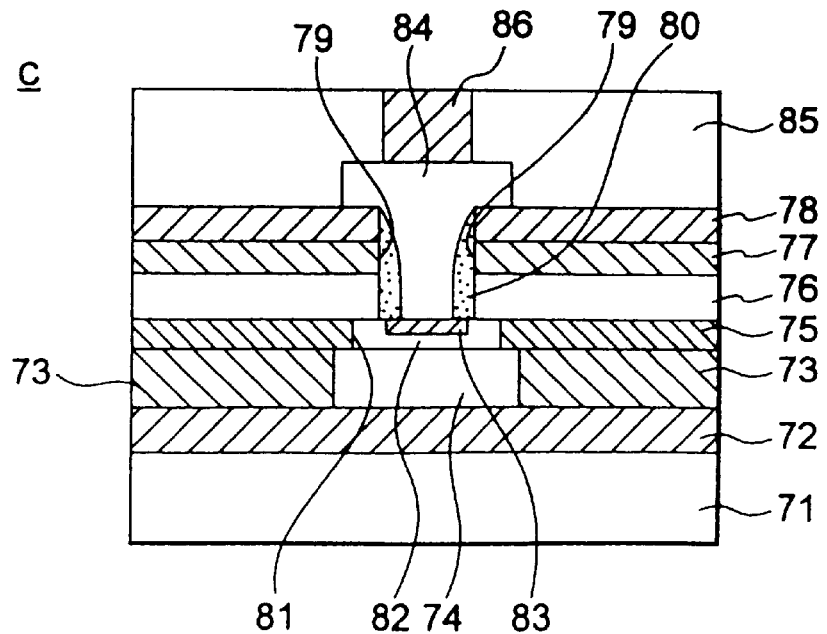

The bipolar transistor A has a structure in which, as shown in FIG. 1I, a base layer (a first epitaxial growth layer 14 and a second epitaxial growth layer 17) is formed by the use of epitaxial growth method in an area larger than an active area 13 on a semiconductor substrate 1 on which an isolation structure is formed by a first insulating layer 12, and a base electrode layer is pulled out of the surroundings of the base layer and an upper surface thereof.

In the following, the present invention will be described in detail with reference to FIG. 1A, FIG. 1B, FIG. 1C, FIG. 1D, FIG. 1E, FIG. 1F, FIG. 1G, FIG. 1H and FIG. 1I.

First, as identical as manufacturing methods of existing bipolar transistors B and C, on an upper surface of an exposed active area 13 of, for instance, a p-type semiconductor substrate 1 on which an isolation structure due to a first insulating film 12 is formed as shown in FIG. 1A, a first epitaxial growth layer 14 is formed by the use of selective epitaxial growth method as shown in FIG. 1B to form a part of a base layer.

Next, all over a surface of a semiconductor substrate 1 on which the first epitaxial growth layer 14 is formed as shown in FIG. 1C, a second insulating layer 15 consisting of silicon nitride is formed. The second insulating layer 15 is removable and all thereof is eventually etched out in the later prescribed process. Incidentally, the second insulating layer for description's sake may be called in some cases simply a removable insulating layer in the part except for this part of the specification and in claims.

First, as shown in FIG. 1D, the second insulating layer 15 is treated by the use of CMP method or wet etch-back method to expose an upper surface of a first epitaxial growth layer 14, and an upper portion of the second insulating layer 15 is removed to make contact the first epitaxial growth layer 14 only at the side surface.

Then, a third insulating layer 16 that is a buffer layer and consisting of silicon oxide is formed on an area larger than that of the first epitaxial growth layer 14 on an upper surface of a semiconductor substrate 1. Thereafter, as shown in FIG. 1E, a second insulating layer 15 is removed selectively. Incidentally, for description's sake, the third insulating layer can be in some cases one expressed as the second insulating layer in the part except here in the specification and in claims.

Thereafter, as shown in FIG. 1F, by the use of selective epitaxial growth method, from a side surface of the first epitaxial growth layer 14, a second epitaxial growth layer 17 that forms the rest of the base layer is formed.

At this time, under the epitaxial growth condition of, for instance, growth temperature of 700° C., pressure of 1330 Pa, $SiH_2Cl_2$ gas of 0.4 l/min, and $H_2$ gas of 15 l/min, a dopant gas such as $B_2H_6$ is added to be a desired impurity concentration in the base layer. The impurity concentration at this time is preferable to be set to be higher than the impurity concentration of the first epitaxial growth layer 14. By raising an impurity concentration such high, the value of resistance of the base layer can be set smaller.

Further, the second epitaxial growth layer 17 is preferable to grow to such a degree to expose peripheral area thereof from the third insulating layer 16. Thus, by forming the second epitaxial growth layer 17 in an area larger than the third insulating layer 16, enough contact with a first poly-silicon layer 18 that becomes a base electrode layer that is formed later can be taken.

Then, as shown in FIG. 1G, all over the surface of the semiconductor substrate 1 on which a base layer (the first epitaxial growth layer 14 and the second epitaxial growth layer 17) and a third insulating layer 16 are formed, a first poly-silicon layer 18 that is a base electrode layer and contains an impurity such as B in high concentration is formed, and further on the first poly-silicon layer 18 a fourth insulating layer 19 that is an interlayer film and consisting of silicon oxide and a fifth insulating layer 20 consisting of silicon nitride are formed.

Thereafter, as shown in FIG. 1H, an opening 21 for pulling out an emitter layer 23 is formed, while locating approximately in the center of the area of the third insulating layer 16, in the first poly-silicon layer 18, and the fourth and the fifth insulating layers 19 and 20 by the use of anisotropic etching method. At this time, the opening 21 is stopped on the third insulating layer 16.

Thereafter, as identical as the first existing method, on the inner surface of the opening 21 a sixth insulating layer 22 consisting of silicon nitride is formed. Then, another opening 24 is opened in the third insulating layer 16 by the use of anisotropic etching method to expose the first epitaxial growth layer 14.

Then, a third poly-silicon layer 25 that contains an impurity such as Sb in high concentration is formed inside the openings 21 and 24 so that a part thereof locates on the upper surface of the fifth insulating layer 20 to form an emitter electrode layer. Thereafter, heat treatment is implemented to form an emitter layer 23 inside the first epitaxial growth layer 14.

Finally, all over the surface of the semiconductor substrate 1 a sixth insulating layer 26 consisting of silicon oxide is patterned. After that, a wiring 27 for pulling out an emitter electrode (the third poly-silicon layer 25) outside is formed. Thereby, a bipolar transistor A that involves the present invention and is shown in FIG. 1I can be manufactured.

According to the present invention, in an area larger than the active area 13 a base layer of low resistance can be formed. Accordingly, an emitter layer can be spaced with enough distance apart from the surroundings of the base layer. As a result of this, withstand voltage of base-emitter is less likely to deteriorate and leakage is less likely to occur. Further, even when an active area 13 is made small, alignment of a mask can be carried out with allowance to provide a stable bipolar transistor.

Further, a base layer is constituted of a first epitaxial growth layer 14 and a second epitaxial growth layer 17. Thereby, the resistance of the base layer can be made small and furthermore only at the SDG area a collector layer connects with the base layer. As a result of this, bipolar transistors of high-speed operation and low power consumption can be provided.

In particular, according to the manufacturing method, a base layer can be formed in an area larger than that of an upper surface of an active area 13. Even when an opening 21 for pulling out an emitter layer is formed on an approximately equal area with the active area 13, mask alignment is carried out with allowance. As a result of this, a semiconductor device that can secure enough distance between emitter-base electrode and is capable of preventing withstand voltage deterioration or leakage between emitter-base from occurring can be manufactured easily.

Moreover, the base layer is formed by disposing a second epitaxial growth layer 17 in the surroundings of a first epitaxial growth layer 14 formed on an upper surface of an active area 13. Accordingly, impurity concentrations of the first and second epitaxial layers can be controlled in high concentration respectively. As a result of this, resistance of the base can be made substantially small. In addition, by controlling the impurity concentration of the second epitaxial growth layer 17 higher than that of the first epitaxial growth layer, substantial resistance of the base can be made further small.

In addition, after a first epitaxial growth layer 14 is formed on an upper surface of an active area 13, in the surroundings thereof a second epitaxial growth layer 17 is formed. Therefore, a base-collector junction area is uniquely decided by the size of the SDG area and does not depend on the size of the opening 21 for pulling out the emitter layer. As a result of this, without increasing capacitance between base-collector, an opening 21 can be formed in an area approximately equal with the SDG area 13.

For instance, a second epitaxial growth layer 17 can be formed in the following manner. In the surroundings of the first epitaxial growth layer 14, the second insulating layer 15 is formed, thereafter a third insulating layer 16 is formed at least on the area of the first epitaxial growth layer 14 and on the upper surface of the second insulating layer 15, and after that the second insulating layer 15 is etched and removed to form a second epitaxial growth layer 17.

At this time, by forming the second insulating layer 15 out of silicon nitride, by making use of difference of etching speed, only in the surroundings of a first epitaxial growth layer a second insulating layer 15 can be formed, and a third insulating layer 16 is formed easily on an upper surface of the first epitaxial growth layer 14. In addition, after formation of the third insulating layer 16, without implementing etching treatment on the first insulating layer 12 that forms an isolation structure, only the second insulating layer 15 can be easily removed.

Further, a third insulating layer 16 can be formed on an area larger than a first epitaxial growth layer 14. Thus, when a third insulating layer 16 of an area larger than the first epitaxial layer 14 is formed on an upper surface of the first epitaxial growth layer 14, on a side surface of the first epitaxial growth layer 14 a second epitaxial growth layer 17 can be grown easily.

Still further, by forming a second epitaxial growth layer 17 with an area larger than a third insulating layer 16, a side surface and an upper surface of a base layer (the second epitaxial growth layer 17) can establish sufficient contact with a base electrode layer (the first poly-silicon layer 18).

Still further, in particular, since the semiconductor device is provided with a base layer disposed in an area larger than an SDG area 13, even when an opening 21 for pulling out an emitter electrode layer is formed in an area of approximately equal size with that of the SDG area 13, alignment of a mask for opening preparation can be carried out with allowance. As a result of this, distance between the emitter and base electrode can be secured enough, and deterioration of the withstand voltage and leakage between the base-emitter can be prevented from occurring.

Further, such a structure can form a first epitaxial growth layer 14 only on an upper surface of an SDG area 13. As a result of this, without increasing the junction area of base-collector, the base layer can be formed.

At this time, on an upper surface of a first epitaxial growth later 14, a third insulating layer 16 extending at least towards peripheral direction than the first epitaxial growth layer 14 is disposed. Thereby, from a side surface of the first epitaxial growth layer 14, a second epitaxial growth layer 17 can be formed easily.

Still further, a third insulating layer 16 can be formed in an area smaller than a second epitaxial growth layer 17. In the case of such a structure being taken, an upper and side surfaces of a second epitaxial growth layer 17 can secure enough connection with a base electrode layer.

Further, by making an impurity concentration of a second epitaxial growth layer 17 higher than that of a first epitaxial growth layer, the resistance of the base can be made further smaller.

Still further, in particular, in the semiconductor device, since a base layer is disposed in an area larger than an active area 13, enough distance can be secured between the emitter-base electrode. Accordingly, deterioration of withstand voltage and leakage between the emitter-base can be prevented from occurring.

Further, a first epitaxial growth layer 14 can be formed only on an upper surface of an active area 13, and without increasing the base-collector junction area, the base layer can be formed.

At this time, by forming a removable insulating layer 15 out of silicon nitride, by making use of difference of etching speed, from for instance an insulating layer formed over all the semiconductor substrate, in the surroundings of a first epitaxial growth layer 14 a removable insulating layer can be formed easily. Further, after the insulating layer in the surroundings of a first epitaxial growth layer 14 is formed, without implementing etching treatment on a first insulating layer 12 forming an isolation structure, only the insulating layer is removed easily. Accordingly, without a first insulating layer 12 being etched, a second epitaxial growth layer 17 can be grown in the surroundings of a first epitaxial growth layer 14 without being connected with an active area 13. Accordingly, without increasing the base-collector junction area, the base layer can be formed.

Still further, by forming a third insulating layer 16 larger than an area of the first epitaxial growth layer 14, a second epitaxial growth layer 17 can be formed easily in the surroundings of a first epitaxial growth layer 14.

Further, a third insulating layer 16 can be formed in an area smaller than an area of the second epitaxial growth layer 17. When such a structure is taken, an upper and side surfaces of a second epitaxial growth layer 17 can secure enough electrical connection with a base electrode layer.

Still further, an impurity concentration of a second epitaxial growth layer 17 can be made higher than that of a first epitaxial growth layer 14. Thereby, the resistance of the base can be made further small.

While the present invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

The entire disclosure of Japanese Patent Application No. 9-170162 filed on Jun. 17, 1998 including specification, claims, drawings and summary are incorporated herein by reference in its entirety.

What is claimed is:

1. A manufacturing method of a semiconductor device having a semiconductor substrate on which an isolation structure is formed by an insulating layer consisting of silicon oxide, the isolation structure defining an active area in which a collector layer is formed, the method comprising the steps of:

forming a first epitaxial growth layer that constitutes a first base layer on an upper surface of the collector layer by use of selective epitaxial growth method; and forming a second epitaxial growth layer that constitutes a second base layer in an area larger than the active area in such a manner that the second base layer contacts side surface of the first base layer.

2. The manufacturing method of a semiconductor device as set forth in claim 1, the method, between the step of forming the first epitaxial growth layer and the step of forming the second epitaxial growth layer, further comprising the steps of:

forming a second insulating layer which contacts side surface of the first epitaxial growth layer, forming a third insulating layer at least on an entire upper surface of the first epitaxial growth layer, and etching and removing the second insulating layer.

3. The manufacturing method of a semiconductor device as set forth in claim 2:

wherein the third insulating layer is formed in an area larger than that of the first epitaxial growth layer.

4. The manufacturing method of a semiconductor device as set forth in claim 3:

wherein the second epitaxial growth layer is formed in an area larger than that of the third insulating layer.

5. The manufacturing method of a semiconductor device as set forth in claim 1:

wherein impurity of the second epitaxial growth layer is doped with a concentration higher than that of the first epitaxial growth layer.

6. The manufacturing method of a semiconductor device as set forth in claim 2:

wherein impurity of the second epitaxial growth layer is doped with a concentration higher than that of the first epitaxial growth layer.

* * * * *